United States Patent
Chen et al.

(10) Patent No.: US 9,788,444 B2
(45) Date of Patent: Oct. 10, 2017

(54) LED MODULE SEALING TECHNOLOGY

(71) Applicant: Hangzhou HPWinner Opto Corporation, Hangzhou, Zhejiang (CN)

(72) Inventors: Kai Chen, Zhejiang (CN); Jianming Huang, Zhejiang (CN); Huali Lu, Zhejiang (CN)

(73) Assignee: HANGZHOU HPWINNER OPTO CORPORATION, Hangzhou, Zhejiang Province (CN)

( * ) Notice: Subject to any disclaimer, the term of this patent is extended or adjusted under 35 U.S.C. 154(b) by 391 days.

(21) Appl. No.: 14/403,108

(22) PCT Filed: Jun. 7, 2013

(86) PCT No.: PCT/CN2013/076937
§ 371 (c)(1),
(2) Date: Nov. 21, 2014

(87) PCT Pub. No.: WO2013/182077
PCT Pub. Date: Dec. 12, 2013

(65) Prior Publication Data
US 2015/0128409 A1    May 14, 2015

(30) Foreign Application Priority Data

Jun. 8, 2012 (CN) ............ 2012 1 0188159
May 21, 2013 (CN) ............ 2013 1 0189101
May 21, 2013 (CN) ............ 2013 2 0278363 U

(51) Int. Cl.
*H05K 3/00* (2006.01)
*H05K 5/06* (2006.01)
(Continued)

(52) U.S. Cl.
CPC ............ *H05K 5/062* (2013.01); *F16B 37/00* (2013.01); *F21V 27/02* (2013.01); *F21V 31/04* (2013.01);
(Continued)

(58) Field of Classification Search
CPC .......... H05K 5/062; H05K 3/062; H05K 3/06; H05K 3/061; H05K 3/064; H05K 3/103;
(Continued)

(56) References Cited

U.S. PATENT DOCUMENTS 6,309,257 B1 * 10/2001 Huang ................... H05K 5/061
                                                         174/50.5
2005/0018435 A1 * 1/2005 Selkee ..................... F21L 4/02
                                                         362/427

FOREIGN PATENT DOCUMENTS

CN    101769457 A        7/2010
CN    202118617 U   *   1/2012
(Continued)

*Primary Examiner* — Peter DungBa Vo
*Assistant Examiner* — Azm Parvez
(74) *Attorney, Agent, or Firm* — Muncy, Geissler, Olds & Lowe, P.C.

(57) ABSTRACT

A sealing process of LED modules includes a waterproof wire put through a wire-through hole of a heat sink to be connected with a positive-negative solder joints on a PCB board, which are subjected to glue sealing treatment. A waterproof sealing process is operated between the waterproof wire and wire-through hole. The PCB board is fixed on the heat sink. One sealing ring is placed into a groove. A ring of liquid silica gel is evenly applied along the other groove. The heat sink installed with the PCB board and the waterproof wire are inversely buckled on the lens set which is fixed with the solid silica gel ring and liquid silica gel. At least two waterproof sealing rings are used to isolate an LED (Continued)

chip from the outside so as to prevent all water vapor or other harmful gases from corroding the chip and the PCB.

16 Claims, 9 Drawing Sheets

(51) Int. Cl.
| | | |
|---|---|---|
| *F21V 31/04* | (2006.01) | |
| *F21V 27/02* | (2006.01) | |
| *F16B 37/00* | (2006.01) | |
| *H02G 15/013* | (2006.01) | |
| *H05K 3/10* | (2006.01) | |
| *F21V 29/70* | (2015.01) | |
| *F21Y 105/10* | (2016.01) | |
| *F21Y 115/10* | (2016.01) | |

(52) U.S. Cl.
CPC ........... *H02G 15/013* (2013.01); *H05K 3/103* (2013.01); *F21V 29/70* (2015.01); *F21Y 2105/10* (2016.08); *F21Y 2115/10* (2016.08); *Y10T 29/49124* (2015.01)

(58) Field of Classification Search
CPC ............ H02G 15/013; Y10T 29/49124; Y10T 29/49117; Y10T 29/49002
USPC ........................ 29/829, 846, 825, 832, 592.1
See application file for complete search history.

(56) References Cited

FOREIGN PATENT DOCUMENTS

| CN | 101893221 B | * | 4/2013 |
|---|---|---|---|
| KR | 10-0657590 B1 | | 12/2006 |

* cited by examiner

LED MODULE SEALING TECHNOLOGY

BACKGROUND OF THE INVENTION

Field of the Invention

The present invention relates to an LED lighting device, in particular, to a sealing process for an LED module.

Brief Description of the Related Art

Energy conservation and environmental protection are trending, and LED has therefore been applied more and more widely due to its energy conservation and environmental protection features, long service life, fast start-up time, good safety, and stability. At present, lighting devices of other sources have been gradually replaced by LED lighting devices.

LED products may break down during their usage due to the penetration of moisture or other harmful gases into the base plate or metal oxidation. When the products are used for outdoor lighting, the sealing and waterproof performance should especially be taken into consideration.

Traditional LED products, with the waterproof packaging and tightened screws, are usually heavy and thick, which have great influence on heat dissipation performance. In patent application CN 200910054820.8, a waterproof sealing structure for an LED module and its preparation process are disclosed, and the waterproof sealing structure includes an LED element, base plate, electrode, and circuit board. The LED module is comprehensively covered with a layer of thin film PARYLENE of which the thickness is 3-25 MM. The film is even, tight, transparent, without any voids, and completely fitted, to protect the LED module from intrusion of water, dampness, and air, and also facilitate heat dissipation of the LED element. The thin film PARYLENE is one of PARYLENE N, PARYLENE C, PARYLENE D or PARYLENE VT4.

In the above patent application, parylene thin film is applied on the entire LED module to realize sealing and waterproofing. The disadvantages thereof include that the film can be easily scratched and damaged, rendering short service life. Meanwhile, complete coverage of thin film on the entire lamp means that it is harder to craft and incurs higher costs.

SUMMARY OF THE INVENTION

The present invention provides a sealing process for an LED module, to resolve the technical problems of high cost of sealing and poor effect.

A sealing process for an LED module is provided, comprising:

(1) putting a waterproof wire through a wire-through hole of a heat sink to be connected to positive-negative solder joints on a PCB board, wherein the positive-negative solder joints and the position that the waterproof wire goes through are subjected to glue sealing treatment, and a waterproof sealing process is operated between the waterproof wire and the wire-through hole;

(2) fixing the PCB board on the heat sink;

(3) fixing a lens set with at least two grooves of inner and external side into a stationary fixture of a glue machine, and placing one sealing ring into one of the grooves;

(4) applying liquid silica gel along the periphery of the other groove of the lens set, and the amount of the silica gel is limited to completely sticking the solid silica gel sealing ring;

(5) inversely buckling the heat sink installed with the PCB board and the waterproof wire(s) as processed in step (2) on the lens set, which is set with the solid silica gel ring and the liquid silica gel as processed in step (4), so as to fix the heat sink entirety and the lens set;

(6) making the assembled LED module stand still so that the liquid silica gel is solidified.

Preferably, the waterproof sealing process between the waterproof wire and the wire-through hole further comprises:

setting a bi-directional wedge sealing ring and an external-threaded nut in sequence around the waterproof wire, and then putting the wire through the wire-through hole on the heat sink;

installing a wedge part in one side of the bi-directional wedge sealing ring in the gap between the through hole and the waterproof wire, and screwing the external-threaded nut into the wire-through hole of the heat sink to make it press tightly to the other side of the bi-directional wedge sealing ring.

Preferably, the external-threaded nut is hollow so that the waterproof wire and the sealing ring can go through from its center. There is a thread structure on the internal wall of the through hole and the thread structure matches with the nut. The wedge part in one side of the sealing ring is installed in the gap between the through hole and the waterproof wire, and the wedge part in the other side is press-installed tightly when the nut is screwed, making the through-hole, the sealing ring, the waterproof wire, and the external-threaded nut fit closely by the deformation caused by the sealing ring being pressed in the above process, thus achieving the waterproof effect.

Preferably, a bi-component insulating sealing glue or other sealing glue is adopted to seal the positive-negative solder joints of the PCB board and the position of the waterproof wire of the heat sink after being passed through the wire-through hole. After sealing, it is solidified under room temperature. The other sealing glues refer to all glues that are suitable for sealing except the bi-component sealing glue.

Preferably, fixing the heat sink entirety and the lens set further includes pressing the heat sink entirety into the inverse buckle structure of the lens set and causing deformation of the solid silica gel ring and the liquid silica gel. The inverse buckle structure of the lens set tightly and fixedly connects the heat sink and lens set, and provides protection through the deformation of the solid silica gel ring and the liquid silica gel.

Preferably, the sealing process also includes the heat sink functioning as a lamp holder. The heat sink may be cut from profiles, and the heat sink may select various shapes of profile.

A sealing process for an LED module is provided, comprising:

(1) putting a waterproof wire through a wire-through hole of a heat sink to be connected to positive-negative solder joints on a PCB board, the positive-negative solder joints and the position that the waterproof wire goes through being subjected to glue sealing treatment, and a waterproof sealing process being operated between the waterproof wire and the wire-through hole;

(2) fixing the PCB board on the heat sink;

(3) fixing a lens set into a stationary fixture of a glue machine and placing one sealing ring onto the lens set;

(4) applying liquid silica gel along the periphery of the lens set, and the amount of the silica gel is limited to completely sticking the solid silica gel sealing ring;

(5) inversely buckling the heat sink installed with the PCB board and the waterproof wire(s) as processed in step (2) on the lens set which is set with the solid silica gel ring and the liquid silica gel as processed in step (4), so as to fix the heat sink entirety and the lens set;

(6) making the assembled LED module stand still for 2 hours to solidify the liquid silica gel.

No groove is set on the periphery of the lens set. The sealing ring and the liquid silica gel of step (3) and (4) are respectively set on the periphery side by side.

Alternatively, only one groove is set on the periphery of the lens set, one of the sealing ring and the liquid silica gel of step (3) and (4) is set on the groove, and the other is set inside or on the periphery of the groove.

Preferably, the waterproof sealing process between the waterproof wire and the wire-through hole further includes:

setting a bi-directional wedge sealing ring and an external-threaded nut in sequence around the waterproof wire and then making the wire go through the wire-through hole of the heat sink;

installing the wedge part in one side of the bi-directional wedge sealing ring in the gap between the through hole and waterproof wire, screwing the nut into the wire-through hole of the heat sink, and making it press tightly to the other side of the bi-directional wedge sealing ring.

Preferably, the external-threaded nut is hollow so that the waterproof wire and the sealing ring can go through from its center. There is a thread structure on the internal wall of the through hole and the thread structure matches with the external-threaded nut. A wedge part in one side of the bi-directional wedge sealing ring is installed in the gap between the through hole and the waterproof wire, and the other side is press-installed by the external-threaded nut being screwed in, so that the through hole, the sealing ring, the waterproof wire, and the external-threaded nut are fixed tightly due to the deformation of the sealing ring caused by being pressed in the above process, thereby realizing the waterproof effect.

A sealing process for an LED lighting device includes a heat sink having lamp holder units of various numbers, each lamp holder unit corresponding to one PCB board, and a lens set to constitute an LED module, each module being sealed by the sealing process described in claim 1.

A sealing process for an LED module is provided, comprising:

(1) putting a waterproof wire through a wire-through hole of a heat sink to be connected to a positive-negative solder joints on a PCB board, wherein the positive-negative solder joints and the position that the waterproof wire goes through are subjected to glue sealing treatment, and a waterproof sealing process is operated between the waterproof wire and the wire-through hole; (2) fixing the PCB board on the heat sink;

(3) applying solid gel and liquid silica gel along the inner and external periphery of a lens set, or setting solid gel and/or liquid silica gel only along the inner periphery or the external periphery of the lens set;

(4) inversely buckling the heat sink installed with PCB board and the waterproof wire(s) as processed in step (2) on the lens set which is set with solid silica gel ring and liquid silica gel or on the lens set which is set with solid silica gel ring only or set with liquid silica gel only as processed in step (3), so as to fix the heat sink entirety and the lens set;

Compared with existing technologies, the present invention has the following advantages:

Firstly, at least two silica gel rings completely isolate the LED chip from the external surroundings, preventing any intrusion of moisture or other harmful gases into the chip and PCB board. Compared with film sealing, it is firmer and renders longer service life. Also, the amount of glue and the product weight can also be reduced compared with glue sealing. Through glue process, special design of the lens set and the solid sealing ring, and sealing performance between the lens set and the heat sink, is guaranteed.

Sealing performance of the wire-through hole of the heat sink is guaranteed by the bi-directional wedge sealing ring and the nut, together with the glue being processed on the connection part of the PCB board and the waterproof wire. In addition, the present invention also adopts the "T"-shaped sealing ring, the external-threaded nut, the sealing glue and the threads in the wire-through hole to seal and achieves good sealing effect. Meanwhile, the combination of sealing ring and sealing glue further ensures sealing performance such that, in case one of them fails in sealing, the other could function independently.

The design of inverse buckle structure of the lens set, together with the duel-protection of the solid silica gel ring and the liquid silica gel, ensure good sealing effect of the lens set and the heat sink. The inverse buckle structure of the lens set results in the same deformation qualities of the solid silica gel ring and liquid silica gel on the entire ring. Consistent pressure of each part ensures uniform sealing of the module and prevents individual defect.

Based on different requirements and demands, heat sinks of various shapes can be selected. The heat sink can include lamp holder units of different numbers to meet the requirements for different powers. Each lamp holder unit independently corresponds to one PCB board, one lens set, and sealing silica gel. When a heat sink includes several lamp holder units, sealing of the entire lamp is divided into sealing of several lamp holder units. Sealing of the entire lamp is improved by improving sealing of the lamp holder unit. Moreover, as the perimeter of the sealing ring of the lamp holder unit is less than that of the entire lamp, sealing performance can be more easily improved.

Good sealing effect is achieved by this simple process, rendering lower cost, longer service life, no damage to products itself, and higher production efficiency. The sealing process of the product reduces the cost and achieves good sealing effect, achieving waterproofing, damp proofing, corrosion protection and oxidation protection, thus prolonging the service life and improving the safety of LED lighting products.

Products processed by the sealing process above have passed strict experimental verification, including the common underwater test, and the 100° C. boiling red ink test. Each of the two protections shall stand in the boiling water test for over 30 minutes. After boiling, it will be immediately placed into the cool water of room temperature to test its waterproof performance with shock chilling. All together, the two protections shall get through boiling water and shock chilling test of 3 hours, over 6 cycles.

DETAILED DESCRIPTION OF THE PREFERRED EMBODIMENTS

Embodiment 1

Figure 1A:
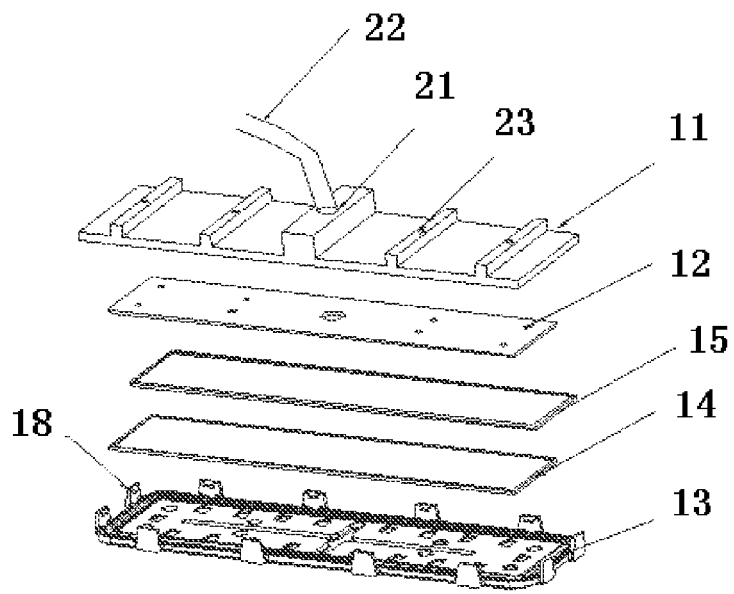
FIG. 1A is an exploded view of one embodiment of the LED module.
Figure 1B:
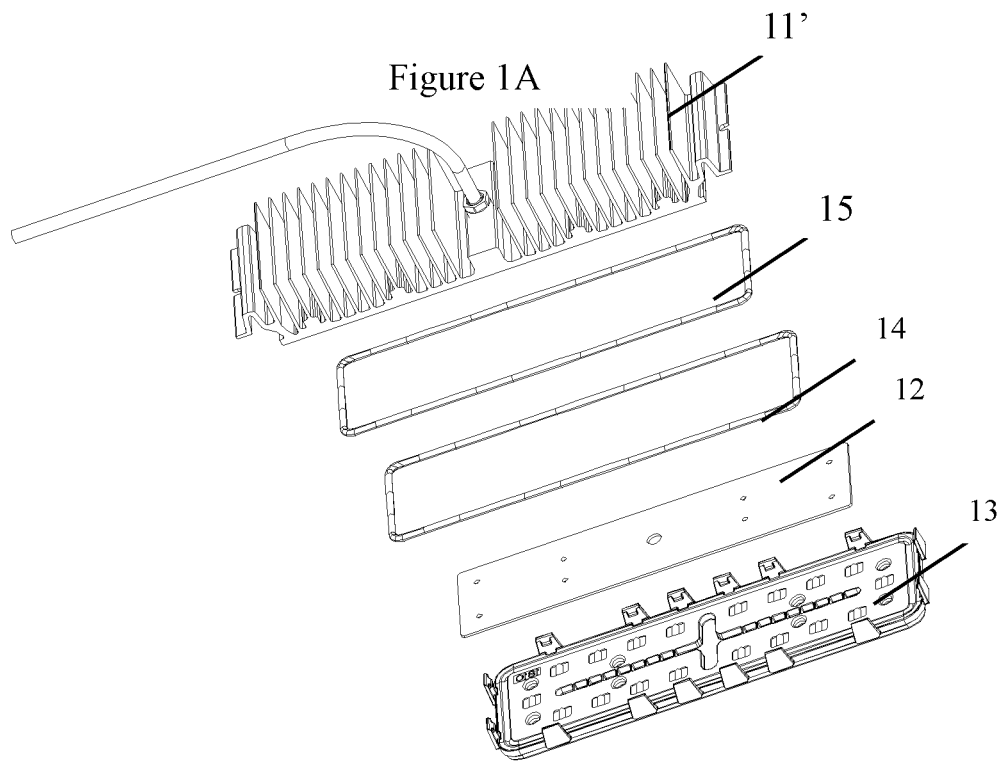
FIG. 1B is an exploded view of another embodiment of the LED module.
Figure 2:
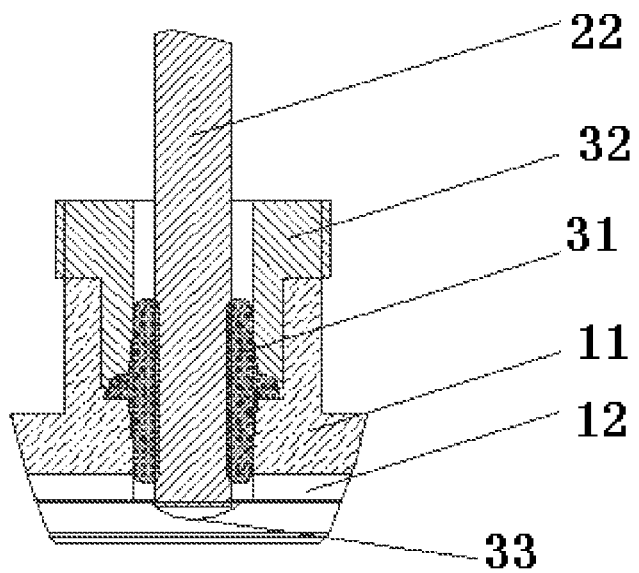
FIG. 2 is a section view of the wire-through hole structure.
Figure 3:
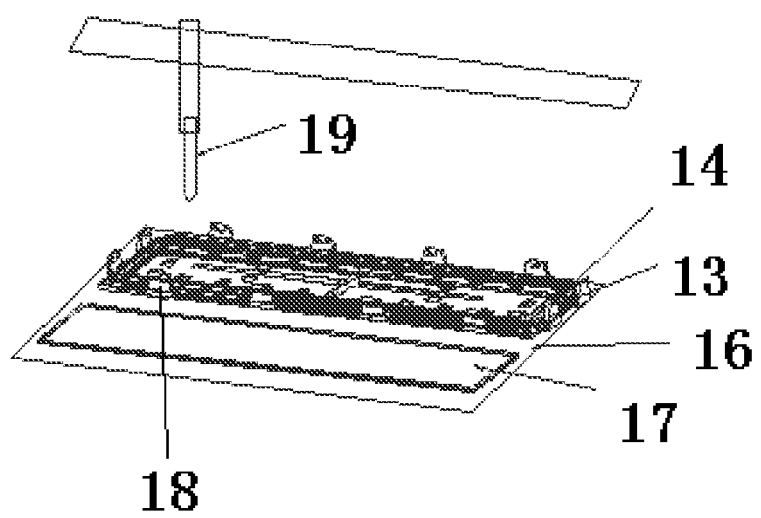
FIG. 3 is a schematic diagram of dispensing.

With reference to FIGS. 1-3, it is a type of technical proposal for LED sealing process. An LED lighting device includes a heat sink 11 (in the present invention, heat sink is the same as radiation holder and, to avoid any confusion, radiation holder is hereby referred to as heat sink), a PCB board 12, an LED chip, a sealing silica gel and lens set 13. The LED chip is welded on the PCB board 12, and the PCB board 12 is fitted with the heat sink 11. The lens set 13 is set above the LED chip.

The heat sink can include one lamp holder unit or several lamp holder units. Each lamp holder unit corresponds to one PCB board 12, one lens set 13 and sealing silica gel. Hereinafter a single lamp holder unit is adopted as an example.

The heat sink 11 could be cut from a profile, functioning both as lamp holder and heat sink. The processing is simple and lower cost. Profile of different shapes for the heat sink can be adopted based on different demands.

On the heat sink 11, a through hole 21 with step-shaped cross section is set through which the waterproof wire 22 of the PCB board 12 is passed. A sealing ring 31 is set in the gap between the through hole 21 and the waterproof wire 22. The sealing ring 31 has a bi-directional wedge shape with a wedge part in one side installed in the gap between the through hole 21 and the waterproof wire 22, and the other wedge part in another side fixed downside with the nut 32, making the through hole 21 and the waterproof wire 22 fit well through the sealing ring 31.

On the heat sink 11, the PCB board 12 is set. The heat sink 11 and the PCB board 12 form surface-contact between them and are fixed by screws. Heat generated on the PCB board 12 can be rapidly dissipated through the heat sink 11.

An LED light source is set on the PCB board 12, and the LED light source directly covers on the PCB board 12, wherein the LED light source can be with or without holder.

The sealing silica gel includes the solid silica gel ring 14 installed on the lens set 13 and the silica gel ring 15 formed by the liquid silica gel pasted on one side of the solid silica gel ring 14. Grooves are set on the lens platform corresponding to the side of the solid silica gel ring 14 for pasting liquid silica gel.

On the plane of the lens set 13 several lens are set, each of which corresponds to one LED light source.

On the periphery of the lens set 13, an inverse buckle structure 18 is designed, by which the heat sink 11 installed with the PCB board 12 is inversely buckled on the lens set 13 that is set with the silica gel ring 14 and the liquid silica gel 15 and is tightly fixed.

Principles of the technology are:

(1) the waterproof wire goes through the wire through-hole of the heat sink and then connects to the positive-negative solder joints on the PCB board, and the positive-negative solder joints and the positions that the waterproof wire goes through are sealed with glue, and a waterproof sealing process is operated between the waterproof wire and wire-through hole;

(2) the PCB board is fixed on the heat sink;

(3) the lens set is fixed with internal and external grooves on a stationary fixture of a glue machine and a sealing ring is placed into the internal groove of the lens set;

(4) a ring of liquid silica gel is pasted evenly along another groove of the lens set and the amount of liquid silica gel is limited to completely sticking the solid silica gel sealing ring;

(5) the glued lens set is solidified under normal temperature for 2 hours;

(6) the heat sink installed with the PCB board and the waterproof wire(s) as processed in step (2) is inversely buckled on the lens set which is set with the solid silica gel ring and the liquid silica gel as processed in step (5), and then the heat sink entirety and the lens set are fixed. At least two waterproof sealing rings completely isolate the LED chip from the external surroundings to prevent any intrusion of moisture or other harmful gases into the chip and PCB board. Compared with film seal, it is firmer and has longer service life, and also can reduce the amount of glue and the product weight when compared to glue sealing.

It should be noted that the wire-through hole can be sealed by other devices. As shown in FIGS. 7-11, the present invention provides a wire-through hole sealing device for sealing a wire-through hole 110 through which an electric wire 140 (or a waterproof wire) goes. The wire-through hole sealing device includes a "T"-shaped sealing ring 130 set around the sealing line and an external-threaded nut 120 set around the downside of the "T"-shaped sealing ring 130.

Figure 7:
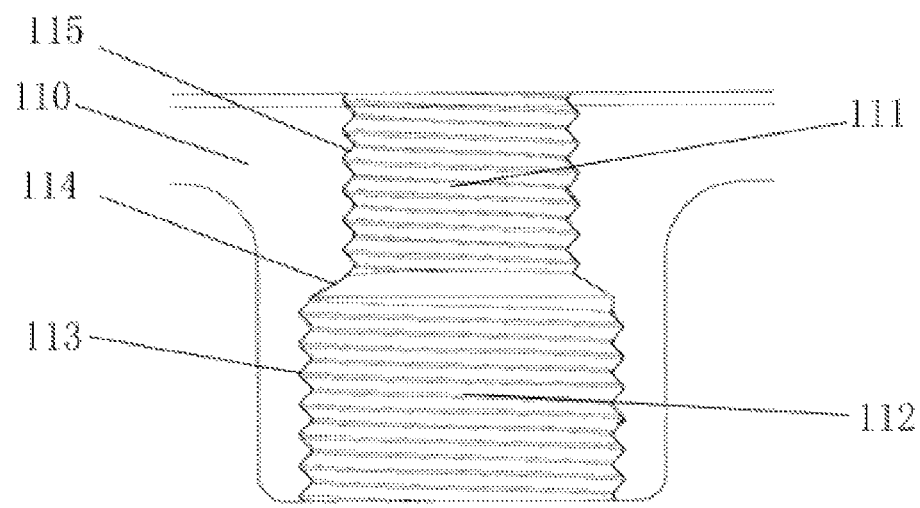
FIG. 7 is an overall stereoscopic view of the second embodiment of the waterproof wire through hole of the present invention.

In the Embodiment, as shown in FIG. 7, the wire-through hole 110 is of cylindrical structure which is narrow in the upside and wide in the downside. More specifically, the upper section of the wire-through hole 110 is a narrow caliber part 111 and the lower section is a wide caliber part 112. A first transitional platform 114 is set at the parting position of the two parts, and first threads 113 are set on the internal side of the wide caliber part 112 of the wire-through hole 110. The first transitional platform 114 is of certain inclination. The narrow caliber part 111 is close to the circuit board and the wide caliber part 112 is away from the circuit board.

Figure 8:
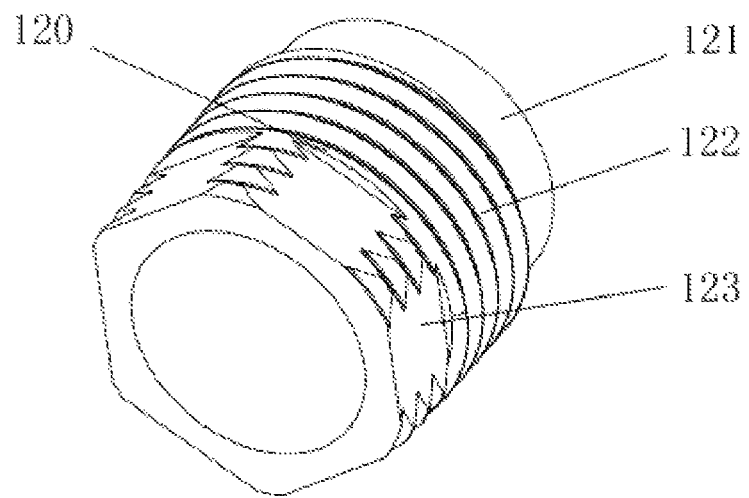
FIG. 8 is a structural diagram of the external-threaded nut in waterproof wire through hole sealing.

In the Embodiment, as shown in FIG. 8, the external-threaded nut 120 is hollow. Second threads 122 are set on the external surface thereof, which matches the primary threads 113. Specifically, the external-threaded nut 120 is divided into three sections, which have the same internal diameter. The upper section of the external-threaded nut 120 is the upper narrow part 121, the second threads 122 are set on the external side of the middle section of the external-threaded nut 120, and the external diameter of the upper narrow part 121 is less than that of the middle section of the external-threaded nut 120. The external thread diameter of the middle section of the external-threaded nut 120 matches the internal thread diameter of the wide caliber part 112 of the wire-through hole 110. The lower section of the external-threaded nut 120 is set with a tightening structure. Specifically, it could be a hexagonal structure 123, for example. The tightening structure can also be realized by other forms which are not limited herein. Diameters of the three sections of the external-threaded nut 120 can be determined based on specific conditions and the external-threaded nut 120 could also not be divided into three sections but, instead, could be one section with threads set on the external surface. It is subject to specific situation, not limited herein.

Figure 9:
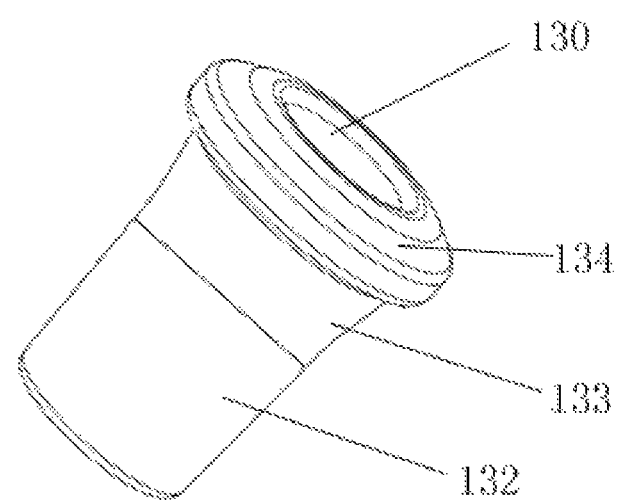
FIG. 9 is a structural diagram of the "T"-shaped sealing ring in waterproof wire through hole sealing.
Figure 10:
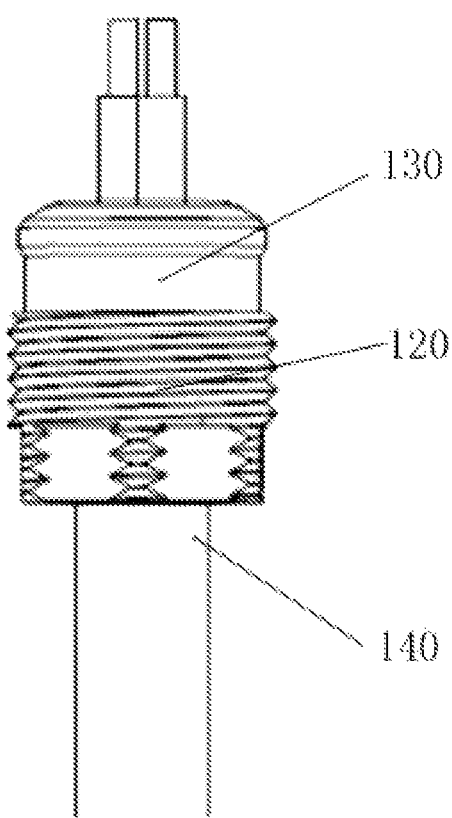
FIG. 10 is a structural diagram of the external-threaded nut and "T"-shaped sealing ring set around the electric wire in waterproof wire through hole sealing.
Figure 11:
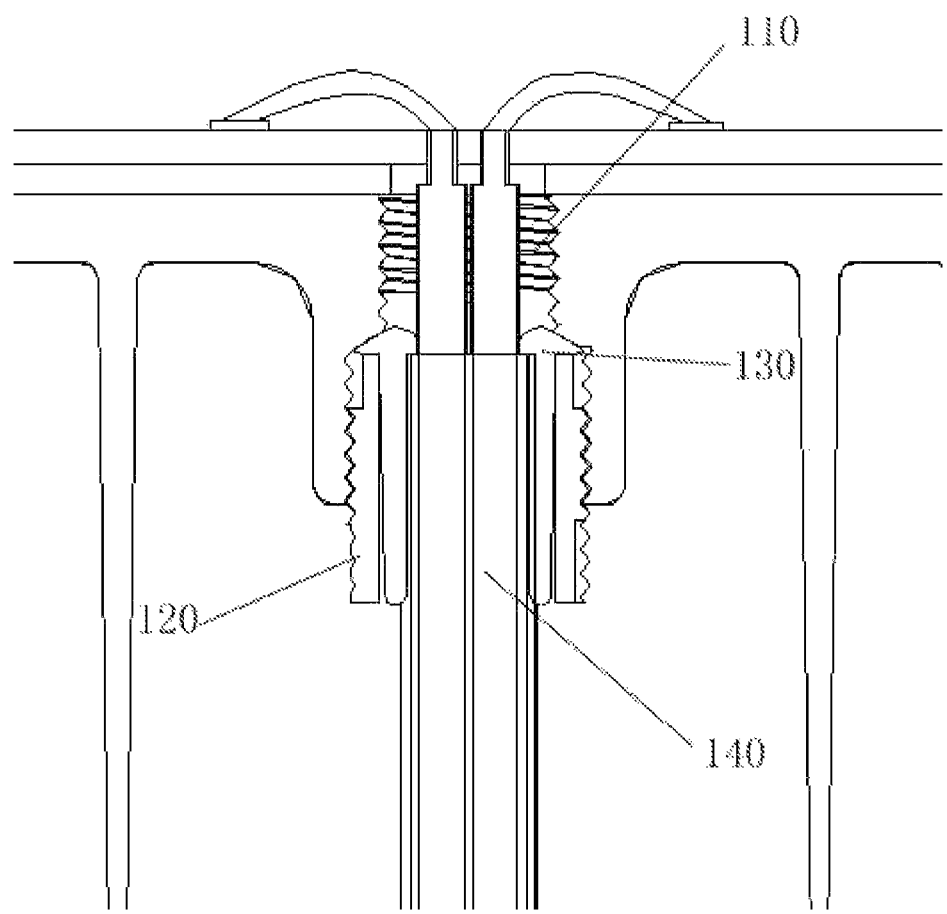
FIG. 11 is a sectional view of a specific embodiment in waterproof wire through hole sealing.

In the Embodiment, the "T"-shaped sealing ring 130 is hollow, wide in the upper side, and narrow in the downside, as shown in FIG. 9. In the upper side it is a wide corona-part 134 and in the lower end it is a narrow part 132, and between the two parts a second transitional platform 133 is set. The narrow part 132 is of circular platform shape, the diameter of the end face of the narrow part 132 at the parting position of the narrow part 132 and the corona-part 134 is larger than the diameter of another end face of the narrow part 132. The narrow part 132 can also be a straight cylinder. The circular platform shape of the narrow part 132 of the Embodiment is designed for facilitating setting the external-threaded nut 120 on the narrow part 132 of the "T"-shaped sealing ring 130. The diameter of the corona-part 134 of the "T"-shaped sealing ring 130 is larger than that of the upper narrow part 121 of the external-threaded nut 120. After the electric line 140 passes through the "T"-shaped sealing ring 130, the external-threaded nut 120 is set around the narrow part 132 of the "T"-shaped sealing ring 130 and one end face of the external-threaded nut 120 is pressed tightly to the second transitional platform 133 of the "T"-shaped sealing ring. Through the second threads on the external-threaded nut 120, the electric line with the "T"-shaped sealing ring and the external-threaded nut is screwed into the wide caliber part 112 of the wire-through hole. As shown in FIG. 11, the upper end face of the corona-part 134 of the "T"-shaped sealing ring 130 is set against the first transitional platform 114 at the parting position of the narrow caliber part 111 and the wide caliber part 112 of the wire-through hole. The upper end of the external-threaded nut 120 and the lower end of the narrow caliber part 111 of the wire-through hole press the "T"-shaped sealing ring 130 to deform and thus make the "T"-shaped sealing ring, the electric wire, and the wire-through hole fit tightly, realizing a sealing effect.

In the Embodiment, after the electric wire 140 is connected to the wire-through hole through the external-threaded nut 120 and the "T"-shaped sealing ring 130, sealing colloids are filled into the gap between the wire-through hole and the electric wire 140 above the "T"-shaped sealing ring 130 for further sealing the wire through-hole. Surely, the type of sealing glue is subject to specific conditions, not limited herein. The present invention adopts a "T"-shaped sealing ring, external-threaded nut, sealing glue, and threads in the wire-through hole to seal, and adopts the combination of sealing ring and sealing glue to ensure that, if one of them fails to provide a seal, the other will independently function.

In the Embodiment, third threads 115 are set on the narrow caliber part 111 upper of the wire through-hole. Sealing colloids are attached to the third thread 115, thereby enhancing the adhesive force of the sealing colloids. It is subject to specific condition, not limited herein.

In the Embodiment, the second transitional platform 133 of the "T"-shaped sealing ring 130 is of certain inclination. When one end face of the external-threaded nut 120 is pressed tightly against the second transitional platform 133 of the "T"-shaped sealing ring 130, inward and upward forces are generated as follows: (1) The inward force presses the external-threaded nut 120 tightly against the "T"-shaped sealing ring 130, meanwhile the "T"-shaped sealing ring 130 is pressed against the electric wire 140. Thus, the electric wire 140 and "T"-shaped sealing ring 130, and the "T"-shaped sealing ring and the external-threaded nut 120, are tightly fit without any gaps; (2) The top of the external-threaded nut 120 is pressed tightly against the bottom of the corona-part 134 of the "T"-shaped sealing ring 130 and, in the meantime, the top of the corona-part 134 of the "T"-shaped sealing ring 130 is pressed tightly against the first transitional platform 114.

In the Embodiment, the external surface of the electric wire 140 could be set with a protective cover which can protect from water and provide an isolation function. It is subject to specific condition, not limited herein.

The wire-through hole sealing device provided by the present invention is implemented as follows.

Firstly, the "T"-shaped sealing ring 130 is set around the electric wire 140, namely the electric wire 140 is passed through the narrow part 132 and the corona-part 134 of the "T"-shaped sealing ring 130 in sequence. The external-threaded nut 120 is set around the narrow part 132 of the "T"-shaped sealing ring 130. As the diameter of the corona-part 134 of the "T"-shaped sealing ring 130 is larger than the diameter of the upper narrow part 121 of the external-threaded nut 120, the second transitional platform 133 of the "T"-shaped sealing ring 130 therefore contacts the upper end face of the upper narrow part 121 of the external-threaded nut 120. The electric wire covered with the "T"-shaped sealing ring 130 and the external-threaded nut 120 is passed through the wide caliber part 112 and the narrow caliber part 111 of the wire-through hole in sequence, and is connected to the internal side of the wire-through hole through the first threads 113 on the wire-through hole and the second threads 122 on the middle section of the external-threaded nut. Here, the second transitional platform 133 of the "T"-shaped sealing ring 130 is pressed against the first transitional platform 114 at the connection part of the narrow caliber part 111 and the wide caliber part 11 of the wire-through hole 2. Under the press of the upper end of the external-threaded nut 120, the "T"-shaped sealing ring 130 is pressed by the upper end of the external-threaded nut 120 and the first transitional platform 114 to deform and thus it can tightly fit the "T"-shaped sealing ring with the electric wire and the wire-through hole for sealing. Finally, sealing colloids are filled into the gap formed by the wire-through hole and the electric wire 140 above the "T"-shaped sealing ring 130 for further sealing.

In conclusion, the Embodiment provides a wire-through hole sealing device, wherein the wire-through hole is narrow upside and wide downside, and with threads set within. The electric wire is connected to the wide caliber part of the wire through-hole through a hollow "T"-shaped sealing ring and a hollow external-threaded nut. The "T"-shaped sealing ring includes a narrow part and a wide corona-part, between which a second transitional platform of certain inclination is set. The "T"-shaped sealing ring is set around the electric wire and the external-threaded nut is set on the narrow part of the "T"-shaped sealing ring with one of its end face pressed tightly against the second transitional platform of the "T"-shaped sealing ring. The external-threaded nut is connected to the wire through-hole by thread connection. The corona-part of the "T"-shaped sealing ring is pressed against the first transitional platform with certain inclination on the parting of the wide caliber part and the narrow caliber part of the wire-through hole. In addition, the gap between the electric wire and the wire-through hole is filled with sealing colloids. The present invention has realized double sealing by the "T"-shaped sealing ring, external-threaded nut, sealing glue, and the threads in the wire through-hole.

Specific technological processes are as follows.

1. The bi-directional wedge sealing ring and the external-threaded nut are set in sequence on the waterproof wire and then the wire is passed through the wire-through hole of the heat sink. The wedge part is installed in one side of the sealing ring in the gap between the through hole and the waterproof wire, the external-threaded nut is screwed into the wire-through hole of the heat sink to press tightly the other side of the bi-directional wedge sealing ring.

The external-threaded nut is hollow through which the waterproof wire and the sealing ring can go through from its center. Thread structure is set on the internal wall of the through-hole and matches with the external-threaded nut. A wedge part in one side of the sealing ring is installed in the gap between the through hole and the waterproof wire, and the other wedge part in another side is installed tightly by screwing the nut, which makes the through hole, the sealing ring, the waterproof wire, and the external-threaded nut fixed tightly by the deformation of the sealing ring through the above process, thereby realizing a waterproof effect.

2. The waterproof wire is passed through the wire through-hole of the heat sink, connecting it to the positive-negative solder joints on the PCB board. A bi-component insulation paste or other sealing glue is used for sealing 33 on the positive-negative solder joints on the PCB board and the position where the waterproof wire of the heat sink is passed through. After sealing, solidifying occurs for 1 hour under normal temperature to further enhance the sealing effect of waterproof wire at the through hole. Preferably, resilient epoxy glue is selected for the bi-component insulation paste which, when adhered with metal, provides excellent anti-shock and chemicals-resistance performance.

3. The PCB board is fixed on the heat sink by fitting surface through a fastening part.

4. The lens set with internal and external grooves is fixed into the stationary fixture of the glue machine 16, and a solid silica gel ring 14 of suitable size is put into the internal groove of the lens set.

5. Desktop robot and glue machine are set, using the glue gun 19 to evenly paste a circle of liquid silica gel along the external groove of the lens set in an amount that can completely stick to the solid silica gel ring. It is then solidified under room temperature for 2 hours. Silica gel is selected for the liquid glue for its excellent viscosity, anti-shock, and UV-resistance performance to metal and PC material.

6. The heat sink installed with the PCB board and the waterproof wire processed in step (2) is inversely buckled on the lens set which is set with solid silica gel ring and liquid silica gel as processed in step (3), and the heat sink entirety is completely pressed into the inverse buckle structure of the lens set through which the heat sink and the lens set are tightly connected. Double protection is realized through the deformation of the solid silica gel ring and the liquid silica gel.

Embodiment 2

Processing steps of Embodiment 2 are similar to that of Embodiment 1, and the differences are as follows. The solid silica gel ring is set in the external groove of the lens set, and then a circle of liquid silica gel is pasted evenly along the internal groove of the lens set. For other processing steps, please refer to Embodiment 1.

Embodiment 3

Only one groove is set on the periphery of the lens set. One of the sealing ring and the liquid silica gel is set on the groove, and the other is set inside or on the periphery of the groove.

Embodiment 4

No groove is set on the periphery of the lens set. The sealing ring and liquid silica gel are respectively set on the periphery side by side.

In other words, a sealing process for an LED module is provided, comprising:

(1) putting the waterproof wire through the wire through-hole of the heat sink and then connecting to the positive-negative solder joints on the PCB board, wherein the positive-negative solder joints and the position that the waterproof wire passes through are subjected to glue sealing treatment, and a waterproof sealing process is operated between the waterproof wire and wire-through hole;

(2) fixing the PCB board on the heat sink;

(3) placing solid silica gel and paste liquid silica gel along the periphery or internal surface of the lens set respectively, or placing solid silica gel and/or paste liquid silica gel only along the periphery or internal surface;

(4) inversely buckling the heat sink installed with PCB board and waterproof wire(s) as processed in step (2) on the lens set which is set with solid silica gel ring and liquid silica gel or set with only the solid silica gel ring or set with only the liquid silica gel as processed in step (3), and fixing the heat sink entirety and the lens set;

Certainly, for the lens set, only an external circle and no internal circle can be set, or vice versa. Similarly, both solid silica gel and liquid glue, or either of them, can be set on it.

These are not the emphasis of the present invention, which only focuses on fixed connection of the heat sink entirety and the lens set.

Figure 4:
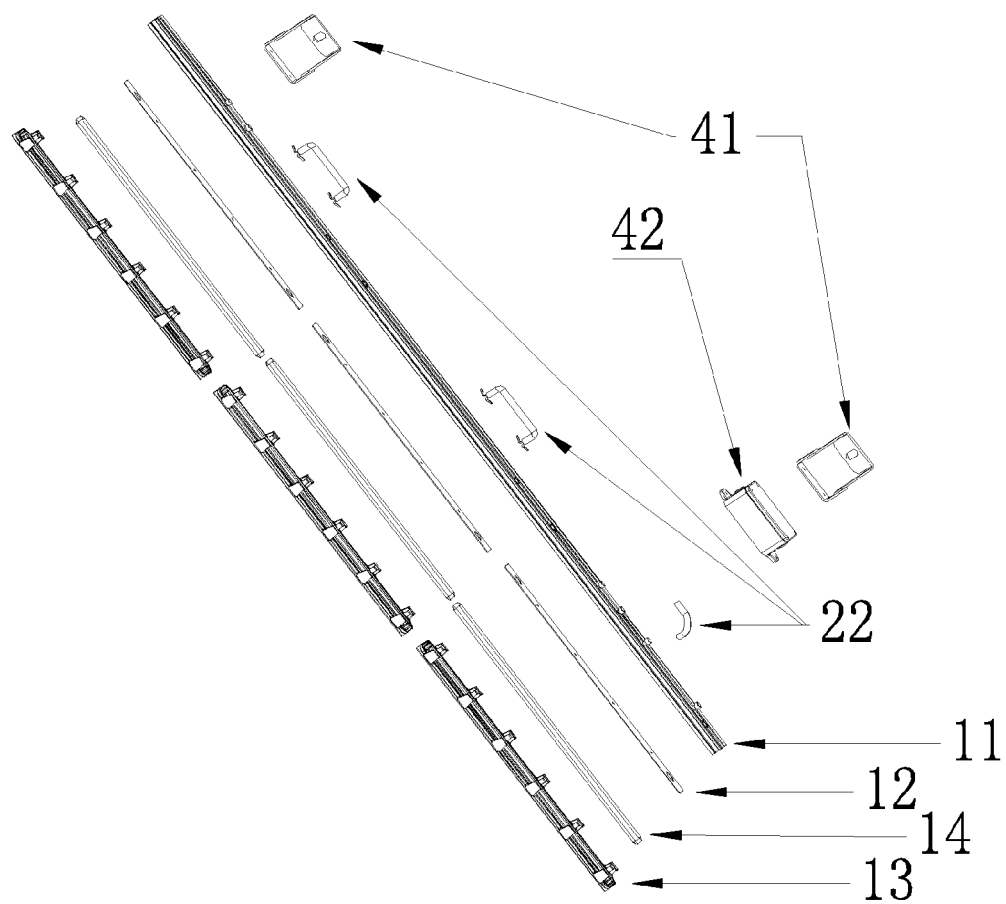
FIG. 4 is an exploded view of one embodiment of the LED lighting device.
Figure 5:
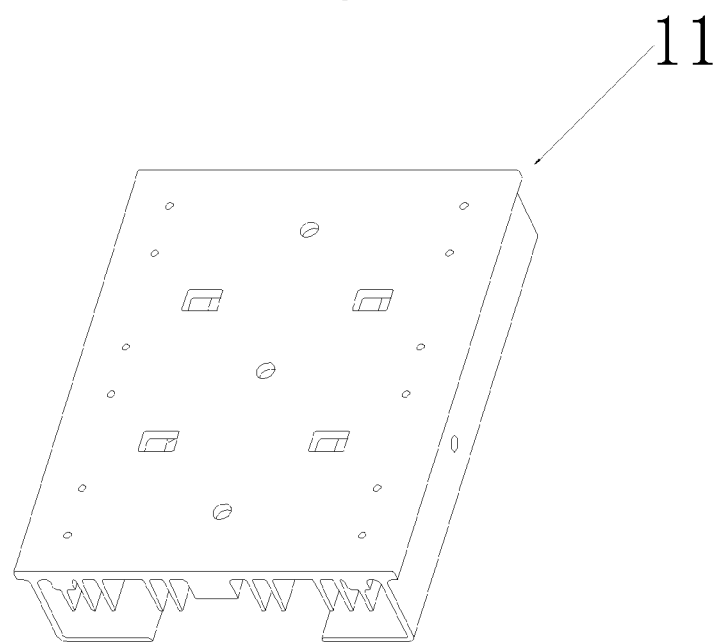
FIG. 5 is a structural diagram of one embodiment of the LED heat sink.

Application 1:

As shown in FIG. 4 and FIG. 5, a sealing process is provided for an LED lighting device, wherein the LED lighting device includes a heat sink 11 with lamp holder units of different numbers. The lamp holder units on the heat sink 11 can be horizontally arranged as shown in FIG. 4, or vertically arranged in FIG. 5. Each lamp holder unit corresponds to one PCB board and one LED module formed one lens set. Each LED module is sealed in either of the two above sealing processes. On the heat sink, power supply waterproof case 42 and installation holder 41 are set for installing external driving power supply. The lighting device is rotated and fixed through the installation holder.

Figure 6:
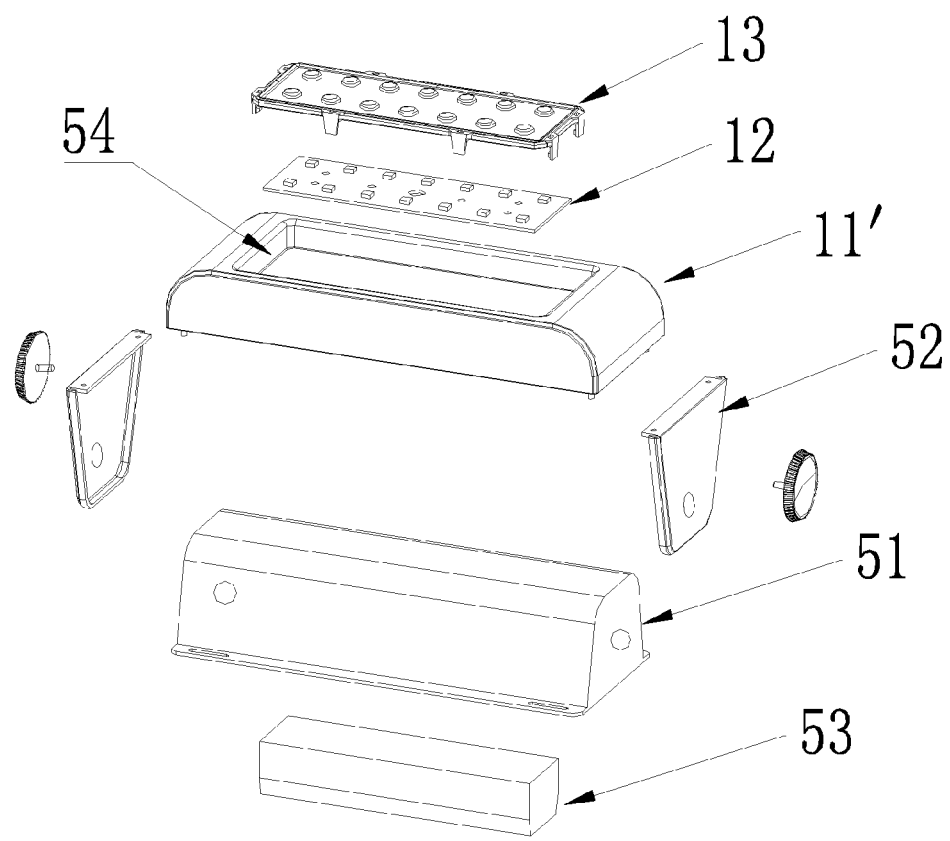
FIG. 6 is a structural diagram of the sealing process of one embodiment of the LED lighting device.

As shown in FIG. 6, a sealing process for an LED lighting device is provided, wherein the LED lighting device includes a lamp holder 11', a lens set 13, a PCB board 12 and a power pack 51. The lamp holder 11' replaces the heat sink holder 11. The lamp holder 11', the PCB board 12 and the lens set 13 form an LED module, for which one of the above two sealing processes is adopted for sealing operation. The lamp holder, through the lamp holder connector 52, is connected to the power pack 51, within which the driving power supply 53 is set. On the lamp holder, a holding groove 54 is set. At the bottom of the holding groove 54, grooves matching the inverse buckle of the lens set are set into which the lens set can be inversely buckled. The lens set 13 together with the PCB board 12 are fixed in the holding groove 54. An LED light source is set on one side of the PCB board and, on the other side it is connected to the bottom face of the holding groove 54 for heat dissipation. The lamp holder is made of aluminum sheet of good heat conduction performance.

Figure 12:
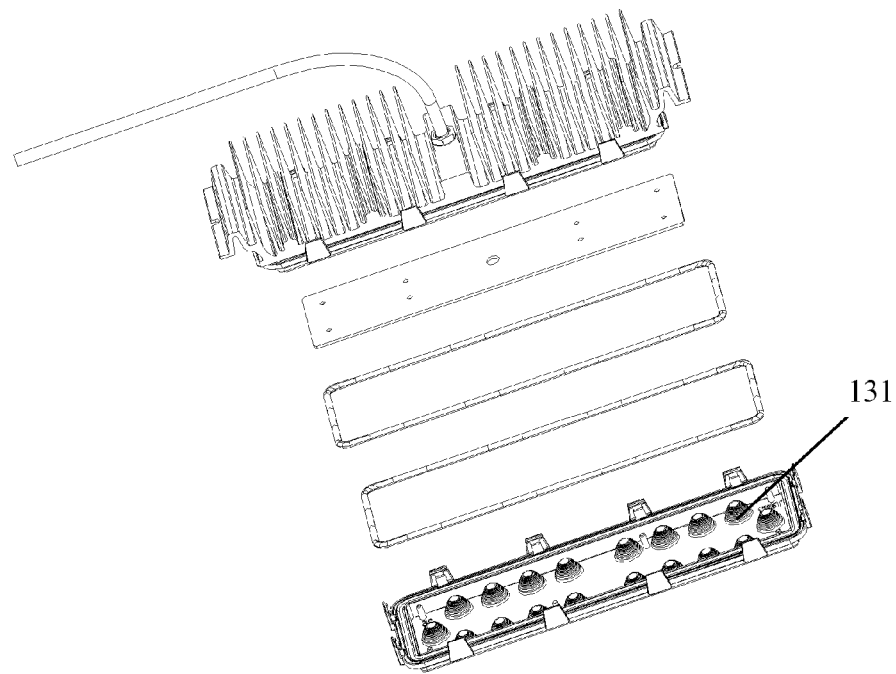
FIG. 12 is a structural diagram of another LED lighting device to which the LED sealing process of the present invention is applicable.

Application 2:

FIG. 1B shows application of a type of LED module to which the sealing process of the present invention is applicable. Compared with FIG. 1, suitable heat sink for the present invention can be the shape as shown in FIG. 12. On the heat sink 11', dissipation fins can be set. Also, heat conduction holders can be set at the two sides. At least one end of the heat conduction holder of the heat sink should be set with "n" shape buckle and "U" shape neck on the internal side of the side frame through which the heat sink and the side frame components are engaged and fixed and forming surface contact.

In other words, compared with FIG. 1, the present invention varies that for the heat sink 11', a heat sink with dissipation fins of better dissipation effect is adopted while other components are basically similar.

In other words, LED modules to which the sealing process of the present invention is applicable are not limited to the shape of heat sinks.

Application 3:

Similarly, for another LED module to which the seal process of the present invention is applicable, the LED lenses are not limited to the lens format shown in FIG. 1. Please refer to FIG. 12. Lens format 131 of the LED module to which the present invention is applicable may be any existing form. Herein no detailed introduction will be given.

Figure 13:
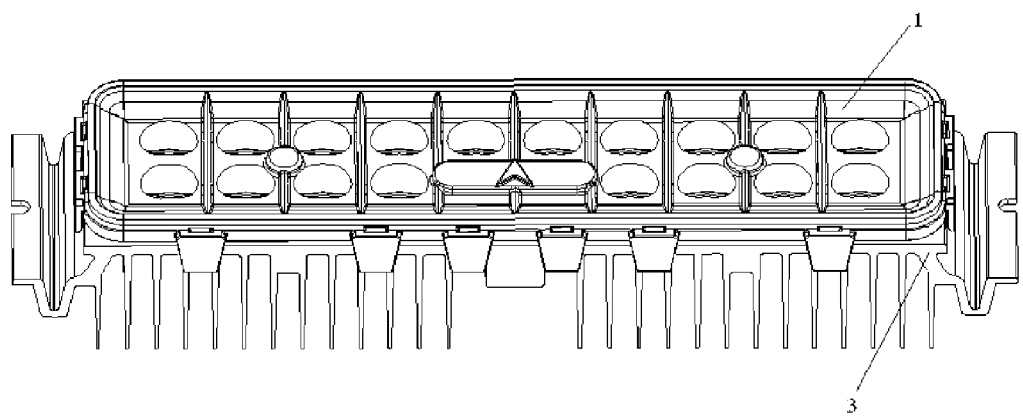
FIG. 13 is a structural diagram of an LED module to which the present invention is applicable.
Figure 14:
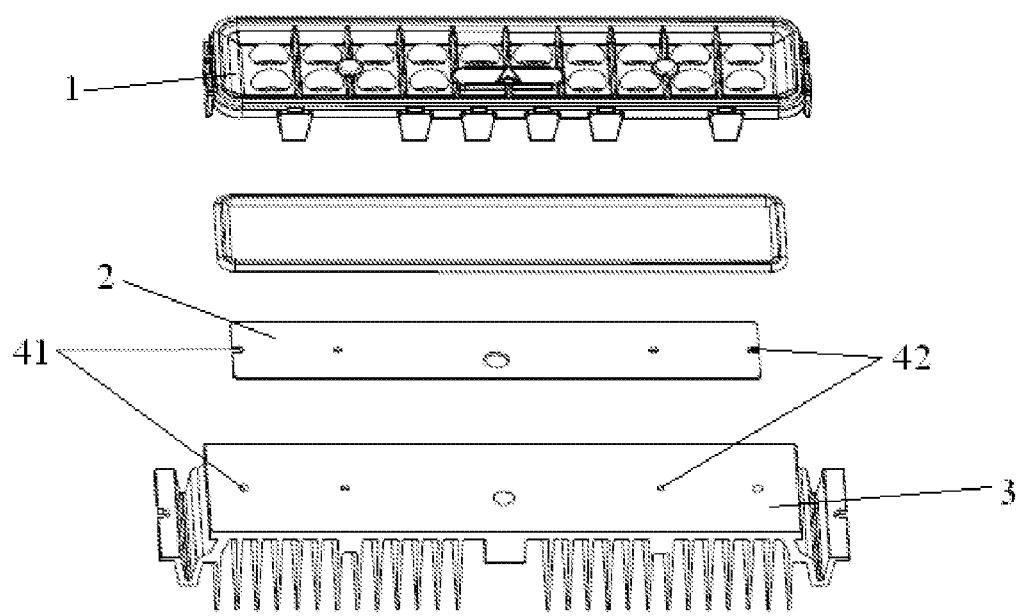
FIG. 14 is an exploded view of an LED module to which the present invention is applicable.

Application 4:

FIG. 13 and FIG. 14 show a type of LED module including a lens set, LED particles, a circuit board, and a heat sink. The LED particles are welded on the circuit board, which is tightly fit with the heat sink and the lens set is set over the heat sink above the LED particle. Packaging colloids are filled into the confined space formed by the lens set and heat sink.

In the Embodiment, the refractive index of packaging colloids is 1.3-1.7, similar to the one of the lens of the lens set. In the LED module of the present invention, packaging colloids replace the original air dielectric in the transmission of light sent out from the LED chip. Moreover, the matching of the refractive index of the packaging colloids and the lens of the lens set improves light out-coupling efficiency to the greatest extent. Lighting efficiency is improved by 10-15% compared to the existing technologies.

For the above LED module, sealing processes are as below:

(1) Corresponding infusion and discharge holes are set respectively on the heat sink and the circuit board;

(2) The LED particle are welded on the circuit board, and then the circuit board is closely fitted to the heat sink. The lens set is covered on the heat sink, wherein the lens set is above the LED particles, and wherein the LED particle includes an LED chip and a dissipation base with the former setting on the latter. Fluorescent powders are coated on the LED chip and an electrode bonding pad is set on the dissipation base.

(3) Packaging colloids are filled through the infusion hole at the bottom of the heat sink into the gap between the heat sink and lens set. The remaining air will be discharged through the discharge hole. The refractive index of packaging colloids is 1.3-1.7.

(4) The infusion hole and discharge hole are sealed by tightening a screw or sealing with glue.

In the LED module of the present invention, the gap formed between the lens set and the heat sink is filled with packaging colloids. The circuit board and each LED particle are covered by the packaging colloids, rendering good waterproofing performance. In the LED module of the present invention, heat generated from the LED particle not only can be transmitted to the circuit board through the bottom of the radiation holder, but also could transmitted to the surrounding through the packaging colloids, rendering higher radiation efficiency.

The details disclosed above are only some embodiments of the application. However, the application should not be limited to the above description. Any alteration the technicians of the art may come up with should be within the scope of protection of the application.

The invention claimed is:

1. A sealing process for an LED module, comprising:
   (1) a waterproof wire goes through a wire-through hole of a heat sink to be connected with a positive-negative solder joints on a PCB board, wherein the positive-negative solder joint and a position that the waterproof wire going through are subjected to glue sealing treatment, and a waterproof sealing process is operated between the waterproof wire and the wire-through hole;
   (2) fix the PCB board onto the heat sink;
   (3) fix a lens set with at least two grooves at inner and external side into a stationary fixture of a glue machine and place one sealing ring into one of the grooves;
   (4) apply evenly a ring of liquid silica gel along the other groove of the lens set, and an amount of the liquid silica gel is limited to completely sticking the sealing ring;
   (5) the heat sink installed with the PCB board and the waterproof wire as processed in step (2) is inversely buckled on the lens set which is set with the solid silica gel ring and the liquid silica gel as processed in step (4), so as to fix the heat sink entirety and the lens set and form an assembled LED module; and
   (6) make the assembled LED module stand still so that the liquid silica gel is solidified;

wherein the wire-through hole includes a narrow caliber part upside and a wide caliber part downside; a first transitional platform is set at a parting of the narrow caliber part and the wide caliber part; first threads are set on an internal side of the wide caliber part downside of the wire-through hole, and the sealing of the wire-through hole is set as below:

set a hollow "T"-shaped sealing ring which includes a narrow part and a wide corona part; a second transitional platform is set between the narrow part and the wide corona part; the "T"-shaped sealing ring is set on a electric wire;

set a hollow external-threaded nut and second threads are set on the external side of the nut, wherein the second threads match with the first threads;

the "T"-shaped sealing ring is set on the electric wire or the waterproof wire, and the external-threaded nut is set around the narrow part of the "T"-shaped sealing ring; the electric wire that set with the "T"-shaped sealing ring and the external-threaded nut around goes in sequence through the wide caliber part and the narrow caliber part of the wire-through hole; the external-threaded nut is set in the wide caliber part of the wire-through hole by the first threads and the second threads; the "T"-shaped sealing ring is intro-pressed tightly by the external-threaded nut and the electric wire is pressed tightly by the "T"-shaped sealing ring; in addition, one end face of the external-threaded nut is pressed tightly to the second transitional platform of the "T"-shaped sealing ring, and in the mean time, the top of the corona-part of the "T"-shaped sealing ring is pressed tightly to the first transitional platform; and a gap between the electric wire or the waterproof wire and the wire-through hole is filled with sealing glue layer.

2. The sealing process for an LED module of claim 1, wherein the waterproof sealing process between the waterproof wire and the wire-through hole further includes:

set a bi-directional wedge sealing ring and an external-threaded nut in sequence around the waterproof wire and then put the wire through the wire-through hole of the heat sink; install a wedge part in one side of the bi-directional wedge sealing ring in a gap between the through hole and the waterproof wire, screw the external-threaded nut into the wire-through hole of the heat sink to make it press tightly another side of the bi-directional wedge sealing ring.

3. The sealing process for an LED module of claim 2, wherein the external-threaded nut is hollow so that the waterproof wire and the sealing ring can go through from its center; there is thread structure on an internal wall of the through-hole that matches with the external-threaded nut; the wedge part in one side of the bi-directional wedge sealing ring is installed in the gap between the through hole and the waterproof wire, and the wedge part in the other side is installed by press of the external-threaded nut through screwed tightly, making the through-hole, the sealing ring, the waterproof wire and the external-threaded nut fit closely through a deformation of the sealing ring when being pressed in the above process, thus achieving a waterproof effect.

4. The sealing process for an LED module of claim 1, wherein third threads are set on the narrow caliber part upside of the wire-through hole, and the sealing glue layer is adhered to the third threads.

5. The sealing process for an LED module of claim 1, wherein the external-threaded nut is hollow and has three-section structures, wherein internal diameters of the three-section structures are similar; an external diameter in the section upside of the external-threaded nut is less than that of the middle section; the second threads are set on the external side of the middle section of the external-threaded nut, and a tightening structure is set on the external side of the section downside of the nut.

6. The sealing process for an LED module of claim 1, wherein the "T"-shaped sealing ring has three-section structures, which include the corona-part, the second transitional platform and the narrow part that connected in sequence, wherein the narrow part is wide upside and narrow downside, and the diameter of the connection interface of the narrow part and the corona-part is larger than the diameter of the other end face of the narrow part.

7. The sealing process for an LED module of claim 1, wherein a bi-component insulating sealing glue or other sealing glue is adopted to seal the positive-negative solder joints of the PCB board and the position that the waterproof wire of the heat sink goes through, and it is solidified under room temperature after sealing glue.

8. The sealing process for an LED module of claim 1, wherein fixing the heat sink entirety and the lens set further includes:

press the heat sink entirety into an inverse buckle structure of the lens set and cause deformation of the sealing ring and the liquid silica gel; the inverse buckle structure at the periphery of the lens set to make the heat sink and the lens set fixed and connected tightly, and to be protected through a deformation of the sealing ring and the liquid silica gel.

9. The sealing process for an LED module of claim 1, further includes:

the heat sink functioning as lamp holder and heat sink is cut from profiles, and the heat sink has various shapes of profile.

10. A sealing process for an LED module, comprising:

(1) a waterproof wire goes through a wire-through holes of a heat sink to be connected with a positive-negative solder joints on a PCB board, wherein the positive-negative solder joints and a position that the waterproof wire passing through are subjected to glue sealing treatment, and a waterproof sealing process is operated between the waterproof wire and the wire-through hole;

(2) fix the PCB board onto the heat sink;

(3) fix a lens set into a stationary fixture of a glue machine and place a sealing ring to a periphery of the lens set;

(4) set liquid silica gel along the periphery of the lens set until the silica gel can completely stick the sealing ring;

(5) the heat sink installed with the PCB board and the waterproof wire as processed in step (2) is inversely buckled on the lens set with the solid silica gel ring and the liquid silica gel as processed in step (4) so as to fix the heat sink entirety and the lens set and form an assembled LED module; and (6) let the assembled LED module stand still until the liquid silica gel is solidified;

wherein the wire-through hole includes a narrow caliber part upside and a wide caliber part downside; a first transitional platform is set at a parting of the narrow caliber part and the wide caliber part; a first threads are set on an internal side of the wide caliber part downside of the wire-through hole, the sealing of which is set as below:

set a hollow "T"-shaped sealing ring which includes a narrow part and a wide corona part; a second transitional platform is set between the narrow part and the wider corona part; the "T"-shaped sealing ring is set on a electric wire;

set a hollow external-threaded nut, and a second threads are set on the external side of the nut, wherein the second threads match with the first threads;

the "T"-shaped sealing ring is set around the electric wire or the waterproof wire, and the external-threaded nut is set on the narrow part of the "T"-shaped sealing ring; the electric wire that set with the "T"-shaped sealing ring and the external-threaded nut goes through the wide caliber part and the narrow caliber part of the wire-through hole in sequence; the external-threaded nut is set in the wide caliber part of the wire through-hole through the first and second threads; the "T"-shaped sealing ring is intro-pressed tightly by the external-threaded nut and the electric wire is pressed tightly by the "T"-shaped sealing ring; in addition, one end face of the external-threaded nut is pressed tightly to the second transitional platform of the "T"-shaped sealing ring, and in the mean time, the top of the corona-part of the "T"-shaped sealing ring is pressed tightly to the first transitional platform; and a gap between the electric wire or the waterproof wire and the wire-through hole is filled with sealing glue layer.

11. The sealing process for an LED module of claim 10, further includes:

no groove is set on the periphery of the lens set; and the sealing ring and the liquid silica gel in step (3) and (4) are respectively set on the periphery side by side.

12. The sealing process for an LED module of claim 10, further includes:

only one groove is set on the periphery of the lens set;

one of the sealing ring and the liquid silica gel of step (3) and (4) is set on the groove, and the other is set onto the inner circumference or the periphery of the groove.

13. The sealing process for an LED module of claim 10, wherein the waterproof sealing process between the waterproof wire and wire-through hole further includes:

set a bi-directional wedge sealing ring and a external-threaded nut in sequence around the waterproof wire and then get the wire go through the wire-through hole of the heat sink; install the wedge part of one side of the bi-directional wedge sealing ring in a gap between the through-hole and the waterproof wire, screw the nut into the wire-through hole of the heat sink so that it can tightly press the another side of the bi-directional wedge sealing ring.

14. The sealing process for an LED module of claim 13, wherein the external-threaded nut is hollow, through which the waterproof wire and the sealing ring can pass from its center; a thread structure is set on an internal wall of the through-hole so as to be matched with the external-threaded nut; the wedge part of one side of the bi-directional wedge sealing ring is installed into the gap between the through-hole and the waterproof wire, and the wedge part of the another side is tightly pressed to install by the nut screwing in, making the through-hole, the sealing ring, the waterproof wire and the external-threaded nut keep tightly fit by a deformation of the sealing ring through the above process to realize a waterproof effect.

15. A sealing process of an LED lighting device, wherein the LED lighting device comprises a heat sink containing various numbers of lamp holder units, and each lamp holder unit corresponds to one PCB board, one lens set to constitute one LED module, and each LED module is sealed by the sealing process described in claim 1.

16. A sealing process of an LED lighting device, wherein the LED lighting device comprises a heat sink containing various numbers of lamp holder units, and each lamp holder unit corresponds to one PCB board, one lens set to constitute one LED module, and each LED module is sealed by the sealing process described in claim 10.

* * * * *